United States Patent
Peng et al.

(10) Patent No.: US 10,867,102 B2
(45) Date of Patent: Dec. 15, 2020

(54) INVERTED PITCH IC STRUCTURE, LAYOUT METHOD, AND SYSTEM

(71) Applicant: TAIWAN SEMICONDUCTOR MANUFACTURING COMPANY, LTD., Hsinchu (TW)

(72) Inventors: Shih-Wei Peng, Hsinchu (TW); Chih-Ming Lai, Hsinchu (TW); Charles Chew-Yuen Young, Cupertino, CA (US); Jiann-Tyng Tzeng, Hsinchu (TW); Wei-Cheng Lin, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/204,944

(22) Filed: Nov. 29, 2018

(65) Prior Publication Data

US 2020/0004914 A1    Jan. 2, 2020

Related U.S. Application Data

(60) Provisional application No. 62/691,598, filed on Jun. 28, 2018.

(51) Int. Cl.
*H01L 23/528*       (2006.01)
*G06F 30/394*      (2020.01)
(Continued)

(52) U.S. Cl.
CPC .......... *G06F 30/394* (2020.01); *G06F 30/392* (2020.01); *H01L 23/528* (2013.01); *H01L 23/5226* (2013.01); *G06F 30/398* (2020.01)

(58) Field of Classification Search
CPC ............ G06F 17/5077; G06F 17/5072; H01L 23/528; H01L 23/5226
See application file for complete search history.

(56) References Cited

U.S. PATENT DOCUMENTS 5,554,874 A    9/1996  Doluca
7,260,442 B2   8/2007  Hwang et al.
(Continued)

FOREIGN PATENT DOCUMENTS

CN    102820280 A    12/2012
WO    WO2018118279   6/2018

OTHER PUBLICATIONS

Notice of Allowance dated Aug. 30, 2019 from corresponding application No. TW 108105401.
(Continued)

*Primary Examiner* — Dung A. Le
(74) *Attorney, Agent, or Firm* — Hauptman Ham, LLP

(57) ABSTRACT

An IC structure includes a first plurality of metal segments in a first metal layer, a second plurality of metal segments in a second metal layer overlying the first metal layer, and a third plurality of metal segments in a third metal layer overlying the second metal layer. The metal segments of the first and third pluralities of metal segments extend in a first direction, and the metal segments of the second plurality of metal segments extend in a second direction perpendicular to the first direction. A pitch of the third plurality of metal segments is smaller than a pitch of the second plurality of metal segments.

20 Claims, 9 Drawing Sheets

(51) Int. Cl.
*H01L 23/522* (2006.01)
*G06F 30/392* (2020.01)
*G06F 30/398* (2020.01)

(56) References Cited

U.S. PATENT DOCUMENTS

| | | |
|---|---|---|
| 8,691,633 B2 | 4/2014 | Liaw |
| 8,884,436 B2 | 11/2014 | Yang |
| 9,256,709 B2 | 2/2016 | Yu et al. |
| 9,972,571 B1 | 5/2018 | Chen et al. |
| 2002/0088998 A1* | 7/2002 | Knall .................... H01L 21/822 257/202 |
| 2005/0186704 A1 | 8/2005 | Yee et al. |
| 2009/0179257 A1* | 7/2009 | Komori ............... H01L 21/8221 257/326 |
| 2010/0171162 A1* | 7/2010 | Katsumata .......... H01L 27/0688 257/314 |
| 2010/0214838 A1* | 8/2010 | Hishida ................... G11C 8/08 365/185.11 |
| 2012/0313256 A1 | 12/2012 | Lu et al. |
| 2014/0040838 A1 | 2/2014 | Liu et al. |
| 2014/0061577 A1* | 3/2014 | Kanno .................... H01L 45/04 257/5 |
| 2015/0278429 A1 | 10/2015 | Chang |
| 2016/0329241 A1* | 11/2016 | Lin ................... H01L 21/76877 |
| 2018/0175011 A1 | 6/2018 | Sung et al. |
| 2018/0269188 A1 | 9/2018 | Yu et al. |

OTHER PUBLICATIONS

Office Action dated Oct. 10, 2020, for corresponding case No. CN 10-2820280 A (pp. 1-8).

\* cited by examiner

INVERTED PITCH IC STRUCTURE, LAYOUT METHOD, AND SYSTEM

BACKGROUND

An integrated circuit (IC) typically includes a number of semiconductor devices represented in an IC layout diagram. An IC layout diagram is hierarchical and includes modules which carry out higher-level functions in accordance with the semiconductor device's design specifications. The modules are often built from a combination of cells, each of which represents one or more semiconductor structures configured to perform a specific function.

Cells typically have a common height to facilitate placement into an IC layout diagram. To form the higher-level modules and enable external connections, cells and other IC features are routed to each other by interconnect structures formed in multiple overlying metal layers. Cell placement and interconnect routing are part of an overall design process for the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
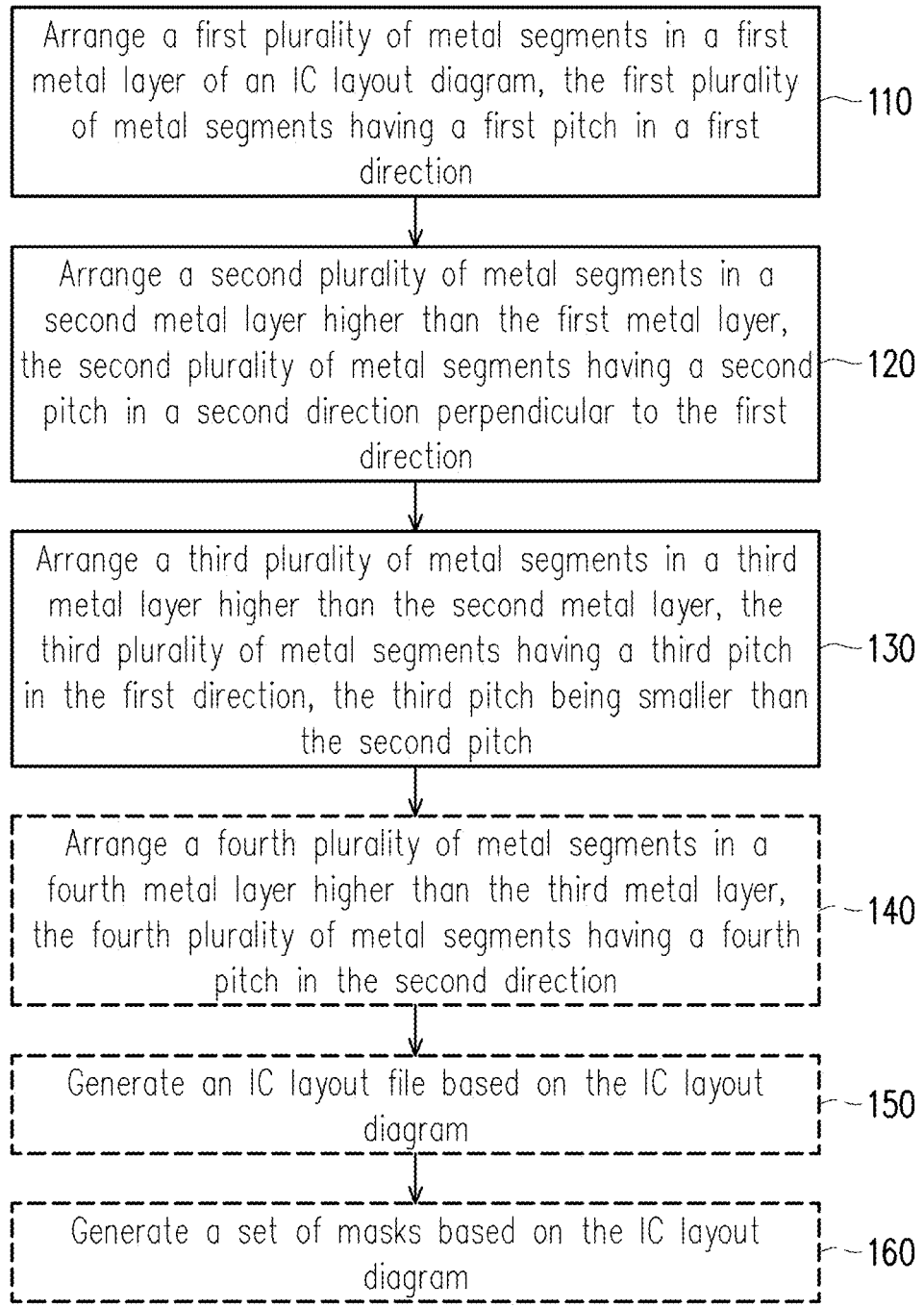
FIG. 1 is a flowchart of a method of generating an IC layout diagram, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, generating an IC layout diagram used to manufacture an IC structure includes arranging first, second, and third layers of metal segments as part of routing electrical connections to cells and other layout diagram features having a feature height. The third layer of metal segments has a pitch along the direction of the feature height and the pitch of the third layer of metal segments is smaller than a pitch of the second layer. Because of the relatively smaller pitch of the third layer, routing flexibility is improved compared to approaches in which the pitch of a given layer is not smaller than the pitch of a lower metal layer. Compared to approaches without the relatively smaller pitch, the greater flexibility enables increased utilization of chip area by allowing more compact arrangements of layout diagram features such as standard cells.

FIG. 1 is a flowchart of a method 100 of generating a layout diagram of an IC, in accordance with some embodiments. The operations of method 100 are capable of being performed as part of a method of forming an IC or a portion of an IC, e.g., IC structure 300 discussed below with respect to FIGS. 3A-3C. In some embodiments, forming the IC is part of forming one or more IC devices, non-limiting examples of which include memory circuits, logic devices, processing devices, signal processing circuits, and the like.

Some or all of the operations of method 100 are capable of being performed as part of an automated placement and routing (APR) method, e.g., an APR method performed by an APR system. In some embodiments, some or all of the operations of method 100 are performed as part of a method 400 of routing connections to a cell discussed below with respect to FIG. 4. Some or all of the operations of method 100 are capable of being performed as part of a design procedure performed in a design house, e.g., a design house 620 discussed below with respect to FIG. 6.

In some embodiments, some or all of method 100 is executed by a processor of a computer. In some embodiments, some or all of method 100 is executed by a processor 502 of an IC layout diagram generation system 500, discussed below with respect to FIG. 5.

In various embodiments, the operations of method 100 are performed in the order depicted in FIG. 1 or in one or more orders other than the order depicted in FIG. 1. In some embodiments, one or more additional operations are performed before, between, during, and/or after one or more operations of method 100.

FIGS. 2A-2D are depictions of a non-limiting example of a plan view of an IC layout diagram 200 at various stages of generating IC layout diagram 200 by executing one or more operations of method 100, in some embodiments. IC layout diagram 200 is simplified for the purpose of clarity. In various embodiments, IC layout diagram 200 includes features in addition to those depicted in FIGS. 2A-2D, e.g., one or more transistor elements, power rails, isolation structures, or the like. Each of FIGS. 2A-2D further depicts a horizontal X direction and a vertical Y direction.

Figure 2A:
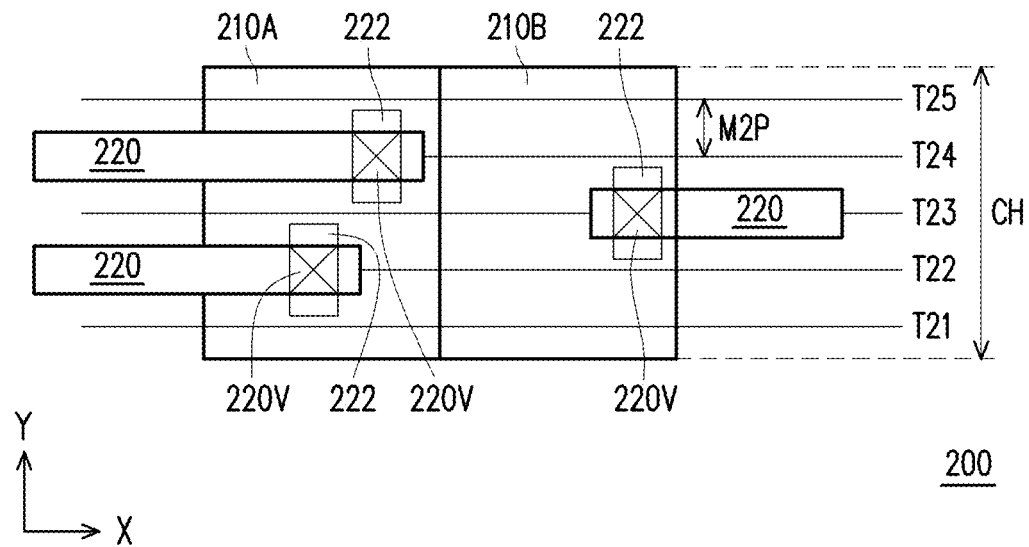
FIGS. 2A-2D are depictions of an IC layout diagram, in accordance with some embodiments.
Figure 2B:
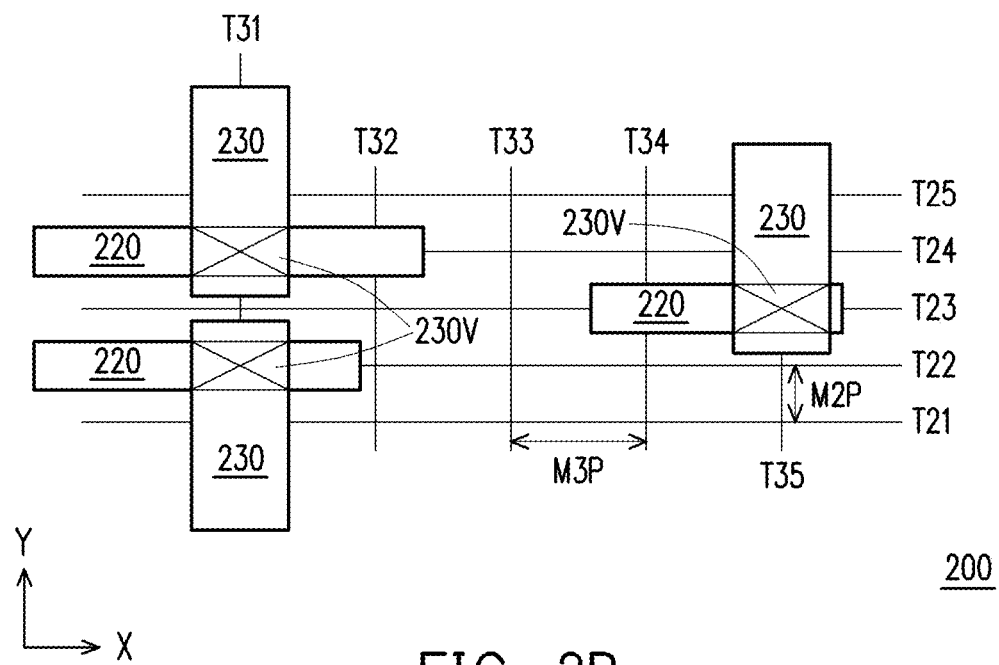
Figure 2C:
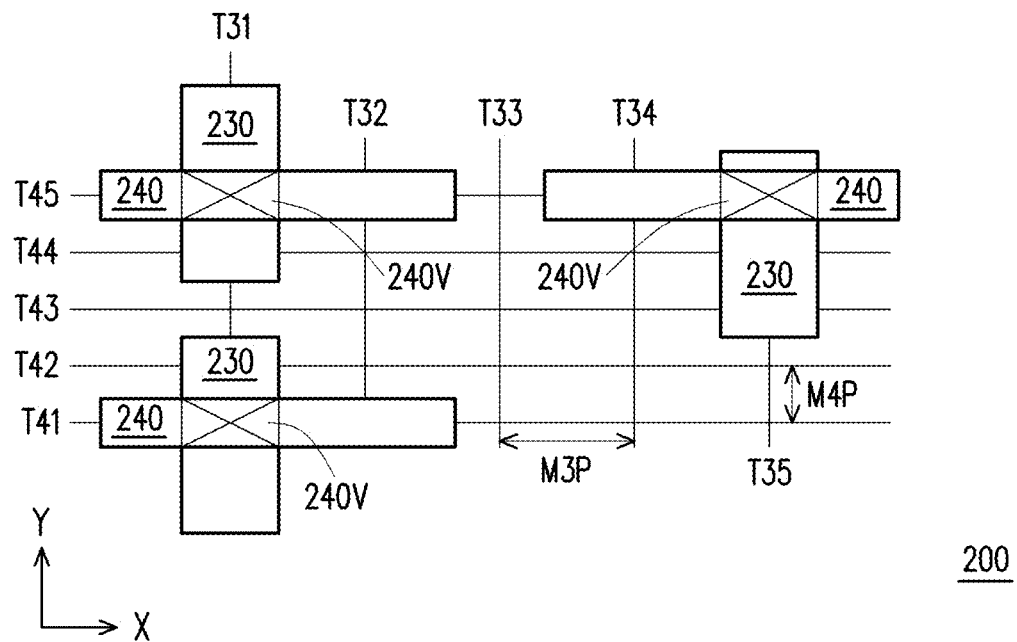
Figure 2D:
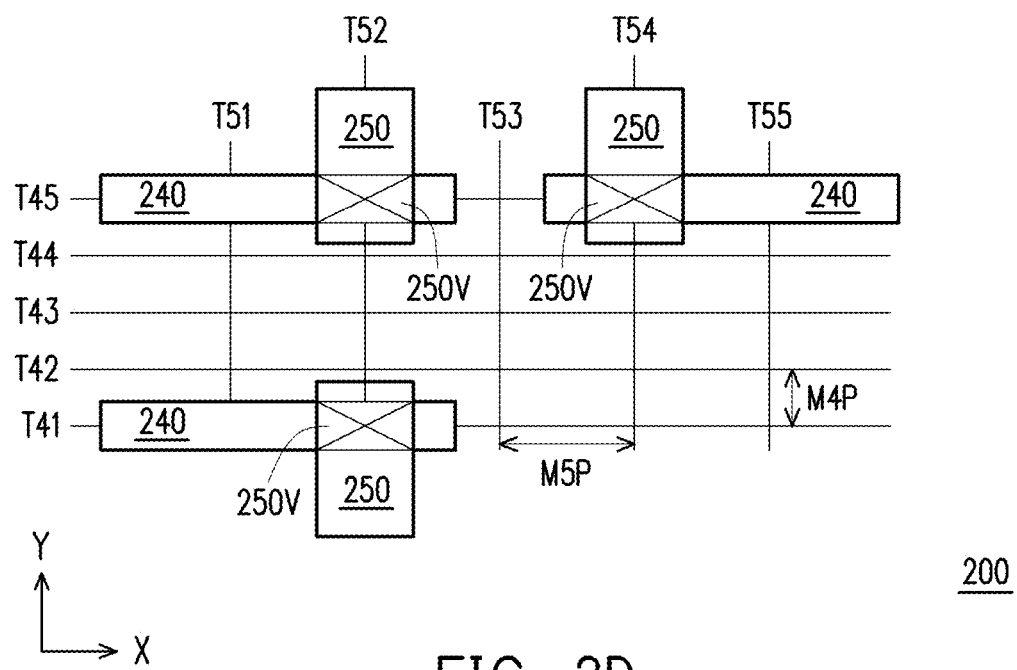
Figure 2E:
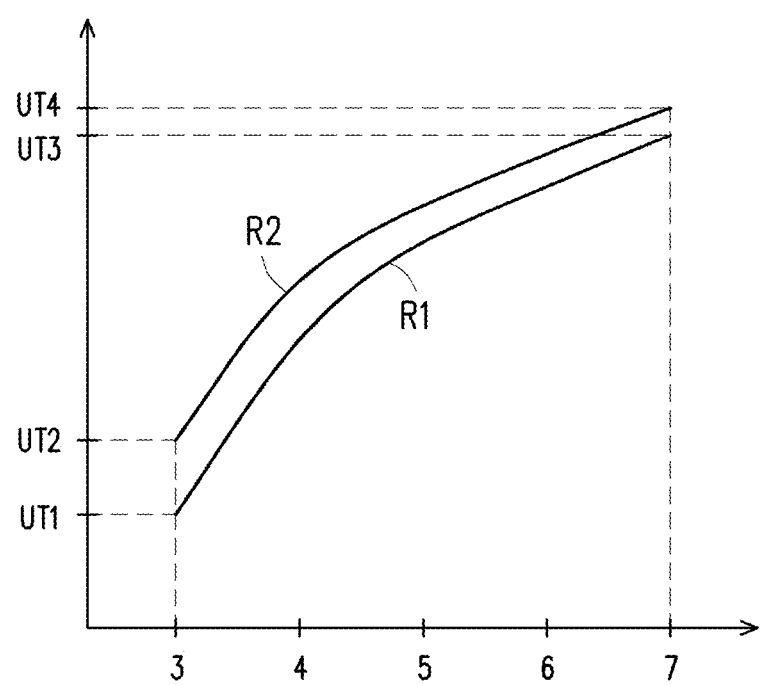
FIG. 2E is a depiction of layout diagram feature and utilization relationships, in accordance with some embodiments.

FIG. 2E is a depiction of layout diagram feature and utilization relationships, as affected by executing one or more operations of method 100, in accordance with some embodiments.

At operation 110, a first plurality of metal segments is arranged in a first metal layer of an IC layout diagram, the first plurality of metal segments having a first pitch in a first direction. Each metal segment of the first plurality of metal segments has a width in the first direction and a length in a second direction perpendicular to the first direction. In various embodiments, the first direction is horizontal and the second direction is vertical, or the first direction is vertical and the second direction is horizontal.

The first pitch defines a multiple by which the metal segments of the first plurality of metal segments are aligned in the first direction in the first metal layer. In some embodiments, arranging the first plurality of metal segments to have the first pitch includes centering each metal segment on a track having the first pitch. The width of each metal segment is thereby divided in half by the track.

In some embodiments, arranging the first plurality of metal segments to have the first pitch includes aligning the metal segments in the first direction based on a common point along the widths of the metal segments without centering each metal segment on a track.

The tracks or common points thereby define a plurality of locations along the first direction at which a metal segment is potentially located. In various embodiments, arranging the first plurality of metal segments to have the first pitch includes positioning at least one metal segment at each possible location along the first direction, or positioning the metal segments by omitting one or more possible locations along the first direction.

In various embodiments, each metal segment of the first plurality of metal segments has a same width, or one or more metal segments of the first plurality of metal segments has one or more widths different from one or more widths of one or more other metal segments of the first plurality of metal segments.

In various embodiments, each metal segment of the first plurality of metal segments has a same length, or one or more metal segments of the first plurality of metal segments has one or more lengths different from one or more lengths of one or more other metal segments of the first plurality of metal segments.

Each metal segment extends along the length between first and second ends. Arranging the first plurality of metal segments includes one or both of aligning two or more metal segments coextensively in the first direction or aligning two or more metal segments non-coextensively in the first direction. Metal segments are considered to be aligned coextensively in the first direction by being intersected by a line extending in the first direction.

Each metal segment extends along the width between first and second sides. Arranging the first plurality of metal segments includes one or both of aligning two or more metal segments coextensively in the second direction or aligning two or more metal segments non-coextensively in the second direction. Metal segments are considered to be aligned coextensively in the second direction by being intersected by a line extending in the second direction.

The first metal layer defines features in one or more layers of a process used to manufacture an IC structure based on the IC layout diagram such that the one or more layers are manufactured overlying various semiconductor devices defined by layout diagram features in one or more lower layers of the IC layout diagram.

Arranging the first plurality of metal segments includes at least one metal segment of the first plurality of metal segments overlapping a layout diagram feature in the IC layout diagram. The layout diagram feature includes one or more IC components arranged in an area having a height in the first direction and a width in the second direction.

In various embodiments, the layout diagram feature is a layout diagram of a cell such as a standard cell, an engineering change order (ECO) cell, a logic cell, a memory cell, or a custom cell, a combination of cells, a capacitive structure, or another IC structure or combination of structures corresponding to an area having the height in the first direction and the width in the second direction.

Arranging the first plurality of metal segments is part of causing electrical connections to be made between a given layout diagram feature and one or more additional layout diagram features and/or other IC structure elements. Accordingly, a number of metal segments of the first plurality of metal segments that overlap the given layout diagram feature is affected by a number of electrical connections that need to be made to and/or from the given layout diagram feature.

The number of metal segments that are capable of overlapping the given layout diagram feature is in turn affected by a ratio of the height of the layout diagram feature to the first pitch. A large ratio corresponds to a relatively large number of metal segments being capable of overlapping the given layout diagram feature, and a small ratio corresponds to a relatively small number of metal segments being capable of overlapping the given layout diagram feature.

In some embodiments, the ratio of the height of the layout diagram feature to the first pitch is equal to or less than five, the number of metal segments capable of overlapping the given layout diagram feature thereby being small relative to IC layout diagrams in which the ratio of the height of the layout diagram feature to the first pitch is greater than five.

A decrease in the ratio of the height of the layout diagram feature to the first pitch, and the corresponding decrease in the number of metal segments capable of overlapping the given layout diagram, limits routing options when making electrical connections to/from the layout diagram feature, as further discussed below with respect to FIG. 2E.

In some embodiments, the layout diagram feature is one layout diagram feature of a plurality of layout diagram features, and arranging the first plurality of metal segments in the first metal layer includes at least one metal segment of the first plurality of metal segments overlapping each layout diagram feature of the plurality of layout diagram features.

In some embodiments, each layout diagram feature of the plurality of layout diagram features requires a corresponding number of electrical connections, and a decrease in the ratio of the height of each layout diagram feature to the first pitch limits routing options when making electrical connections to/from the plurality of layout diagram features. In some embodiments, arranging the first plurality of metal segments includes arranging the metal segments to define portions of a metal two layer of a process used to manufacture an IC structure based on the IC layout diagram. In various embodiments, arranging the first plurality of metal segments includes arranging at least one metal two segment to overlap one or more of a metal one segment, a metal zero segment, a poly region, a gate structure, or a source or drain region of one or more layout diagram features.

In some embodiments, arranging the first plurality of metal segments includes positioning one or more of a via or contact below one or more metal segments of the first plurality of metal segments. Positioning the via or contact includes causing the via or contact to occupy some or all of an area in which the metal segment overlaps a layout diagram feature. In some embodiments, positioning the via or contact includes causing the via or contact to occupy some or all of an area in which the metal segment overlaps a metal one segment, a metal zero segment, a poly region, a gate structure, or a source or drain region of the layout diagram feature. In various embodiments, positioning the via or contact includes positioning a single via, e.g., a slot via, a single contact, or a plurality of vias or contacts in the area in which the metal segment overlaps the layout diagram feature.

In some embodiments, arranging the first plurality of metal segments includes arranging the metal segments to define portions of a metal layer above the metal two layer of an IC process. In various embodiments, the layout diagram feature is a metal segment of a metal layer below the first metal layer, and metal segments of the metal layer below the first metal layer have a pitch less than, equal to, or larger than the first pitch.

FIG. 2A depicts a non-limiting example of arranging a first plurality of metal segments 220 in a first layer of IC layout diagram 200, in accordance with some embodiments. Each metal segment 220 has a length along the X direction, a width along the Y direction, and overlaps one or both of a cell 210A or a cell 210B, each of which has a cell height CH in the Y direction. Each of cells 210A and 210B includes a metal portion 222 and one or more additional features that are not depicted in FIG. 2A for the purpose of clarity.

In various embodiments, one or both of cell 210A or cell 210B is a layout diagram of a standard cell, a custom cell, an engineering change order (ECO) cell, a logic gate cell, a memory cell, or another type of cell or combination of cells capable of being defined in an IC layout diagram. In various embodiments, a logic gate cell includes a layout diagram of one or more of an AND, OR, NAND, NOR, XOR, INV, AND-OR-Invert (AOI), OR-AND-Invert (OAI), MUX, Flip-flop, BUFF, Latch, delay, or clock device. In various embodiments, a memory cell includes a layout diagram of one or more of a static random access memory (SRAM), a dynamic RAM (DRAM), a resistive RAM (RRAM), a magnetoresistive RAM (MRAM), or read only memory (ROM) cell, or another device capable of having multiple states representative of logical values.

In the embodiment depicted in FIG. 2A, arranging metal segments 220 includes centering metal segments 220 on tracks T21 through T25 each having a pitch M2P in the Y direction. In various embodiments, arranging each metal segment 220 relative to one of tracks T21 through T25 includes aligning a given point along the width, e.g., a top or bottom edge, other than the center with the corresponding one of tracks T21 through T25.

A ratio of cell height CH to pitch M2P is equal to five. Accordingly, a number of metal segments 220 capable of overlapping one of cells 210A or 210B is less than a number of metal segments capable of overlapping a cell in an IC layout diagram in which a ratio of cell height to a first pitch is greater than five, and a number of metal segments 220 capable of overlapping one of cells 210A or 210B is greater than a number of metal segments capable of overlapping a cell in an IC layout diagram in which a ratio of cell height to a first pitch is less than five.

In the embodiment depicted in FIG. 2A, arranging metal segments 220 includes no metal segment 220 overlapping a top or bottom edge of cell 210A or cell 210B. In various embodiments, one or more metal segments 220 overlap one or more top or bottom edges of one or both of cells 210A or 210B.

Each metal segment 220 defines a portion of a metal two layer in IC layout diagram 200 and overlies a via 220V. Each via 220V defines a conductive path from a metal segment 220 to a metal portion 222 in one of cells 210A or 210B. In various embodiments, a given metal portion 222 defines a portion of a metal one or metal zero layer in one of cells 210A or 210B.

At operation 120, a second plurality of metal segments is arranged in a second metal layer of the IC layout diagram, the second plurality of metal segments having a second pitch in the second direction. Each metal segment of the second plurality of metal segments has a width in the second direction and a length in the first direction.

The second metal layer defines features in one or more layers of a process used to manufacture an IC structure based on the IC layout diagram such that the one or more layers are manufactured overlying the first metal layer of the IC layout diagram.

The second pitch defines a multiple by which the metal segments of the second plurality of metal segments are aligned in the second direction in the second metal layer. Arranging the second plurality of metal segments in the second metal layer of the IC layout diagram to have the second pitch in the second direction is performed in the manner discussed above for arranging the first plurality of metal segments in the first metal layer of the IC layout diagram to have the first pitch in the first direction.

In various embodiments, arranging the second plurality of metal segments in the second metal layer includes arranging the metal segments to define portions of a metal three layer of an IC process or to define portions of a metal layer above the metal three layer of an IC process.

In various embodiments, the second pitch is smaller than, equal to, or larger than the first pitch.

FIG. 2B depicts a non-limiting example of arranging a second plurality of metal segments 230 in a second layer of IC layout diagram 200, in accordance with some embodiments. Each metal segment 230 has a length along the Y direction, a width along the X direction, and overlaps one or more metal segments 220.

In the embodiment depicted in FIG. 2B, arranging metal segments 230 includes centering metal segments 230 on tracks T31 through T35 having a pitch M3P in the X direction. In various embodiments, arranging each metal segment 230 relative to one of tracks T31 through T35 includes aligning a given point along the width, e.g., a left or right edge, other than the center with the corresponding one of tracks T31 through T35.

Each metal segment 230 defines a portion of a metal three layer in IC layout diagram 200 and overlies a via 230V. Each via 230V defines a conductive path from a metal segment 230 to a metal segment 220.

At operation 130, a third plurality of metal segments is arranged in a third metal layer of the IC layout diagram, the third plurality of metal segments having a third pitch in the first direction. Each metal segment of the third plurality of metal segments has a width in the first direction and a length in the second direction.

The third metal layer defines features in one or more layers of a process used to manufacture an IC structure based on the IC layout diagram such that the one or more layers are manufactured overlying the second metal layer of the IC layout diagram.

The third pitch defines a multiple by which the metal segments of the third plurality of metal segments are aligned in the first direction in the third metal layer. Arranging the third plurality of metal segments in the third metal layer of the IC layout diagram to have the third pitch in the first direction is performed in the manner discussed above for arranging the first plurality of metal segments in the first metal layer of the IC layout diagram to have the first pitch in the first direction.

In various embodiments, arranging the third plurality of metal segments in the third metal layer includes arranging the metal segments to define portions of a metal four layer of an IC process or to define portions of a metal layer above the metal four layer of an IC process.

The third pitch is smaller than the second pitch. Accordingly, an IC structure, e.g., IC structure 300 discussed below with respect to FIGS. 3A-3C, manufactured based on method 100 including operation 130, includes a plurality of metal segments in a third metal layer having a pitch smaller than a pitch of a plurality of metal segments in a second metal layer.

In some embodiments, arranging the third plurality of metal segments in the third metal layer includes using one or more masks, e.g., one or more masks 645 discussed below with respect to FIG. 6, to define an entirety of the metal segments in the third metal layer having the third pitch. In some embodiments, arranging the third plurality of metal segments in the third metal layer includes using one or more masks to define a first subset of the metal segments in the third metal layer having the third pitch, and using one or more additional masks to define one or more additional subsets of the metal segments in the third metal layer having one or more additional pitches larger and/or smaller than the third pitch.

By arranging the third plurality of metal segments in the third metal layer having the third pitch smaller than the second pitch, routing of electrical connections to one or more IC layout diagram features is more flexible than routing of electrical connections in approaches in which a pitch is not smaller than the pitch of a lower metal layer.

Because the third pitch is smaller than the second pitch, a ratio of the second pitch to the third pitch has a value above 1.0. For ratio values near 1.0, routing flexibility increases as the ratio value increases. Additional increases in the ratio value require at least one of an increase in the second pitch or a decrease in the third pitch.

As the second pitch increases, routing flexibility decreases due to the limited size of the one or more IC layout diagram features to which the electrical connections are being defined. As the third pitch decreases, parasitic resistance and/or capacitance of the third plurality of metal segments increases such that meeting various design criteria, e.g., signal propagation speed or heat generation, becomes increasingly difficult.

Because of the limitations to each of increasing the second pitch and decreasing the third pitch, increasing ratio values so as to increase routing flexibility is limited. In some embodiments, the ratio of the second pitch to the third pitch has a value ranging from 1.1 to 1.5. In some embodiments, the ratio of the second pitch to the third pitch is greater than or equal to 1.25.

In various embodiments, the third pitch is smaller than, equal to, or larger than the first pitch.

FIG. 2C depicts a non-limiting example of arranging a third plurality of metal segments 240 in a third layer of IC layout diagram 200, in accordance with some embodiments. Each metal segment 240 has a length along the X direction, a width along the Y direction, and overlaps one or more metal segments 230.

In the embodiment depicted in FIG. 2C, arranging metal segments 240 includes centering metal segments 240 on tracks T41 through T45 having a pitch M4P in the Y direction. In various embodiments, arranging each metal segment 240 relative to one of tracks T41 through T45 includes aligning a given point along the width, e.g., a top or bottom edge, other than the center with the corresponding one of tracks T41 through T45. A ratio of pitch M3P to pitch M4P is equal to 1.25, in accordance with the discussion above with respect to the second and third pitches.

Each metal segment 240 defines a portion of a metal four layer in IC layout diagram 200 and overlies a via 240V. Each via 240V defines a conductive path from a metal segment 240 to a metal segment 230.

At operation 140, in some embodiments, a fourth plurality of metal segments is arranged in a fourth metal layer of the IC layout diagram, the fourth plurality of metal segments having a fourth pitch in the second direction. Each metal segment of the fourth plurality of metal segments has a width in the second direction and a length in the first direction.

The fourth metal layer defines features in one or more layers of a process used to manufacture an IC structure based on the IC layout diagram such that the one or more layers are manufactured overlying the third metal layer of the IC layout diagram.

The fourth pitch defines a multiple by which the metal segments of the fourth plurality of metal segments are aligned in the second direction in the fourth metal layer. Arranging the fourth plurality of metal segments in the fourth metal layer of the IC layout diagram to have the fourth pitch in the second direction is performed in the manner discussed above for arranging the first plurality of metal segments in the first metal layer of the IC layout diagram to have the first pitch in the first direction.

In various embodiments, arranging the fourth plurality of metal segments in the fourth metal layer includes arranging the metal segments to define portions of a metal five layer of an IC process or to define portions of a metal layer above the metal five layer of an IC process.

The fourth pitch is larger than the third pitch. In some embodiments, a ratio of the fourth pitch to the third pitch is greater than or equal to 1.3. In various embodiments, the fourth pitch is smaller than, equal to, or larger than one or both of the first pitch or the second pitch.

In some embodiments, the first, second, third, and fourth metal layers are metal layers of a main routing layer of an IC layout diagram. In some embodiments, the main routing layer includes a number of metal layers ranging from ten to fifteen. In some embodiments, the main routing layer includes twelve metal layers.

In some embodiments, with the exception of the third pitch being smaller than the second pitch, each metal layer of the main routing layer has a pitch greater than or equal to a pitch of each underlying metal layer.

FIG. 2D depicts a non-limiting example of arranging a fourth plurality of metal segments 250 in a fourth layer of IC layout diagram 200, in accordance with some embodiments. Each metal segment 250 has a length along the Y direction, a width along the X direction, and overlaps one or more metal segments 240.

In the embodiment depicted in FIG. 2D, arranging metal segments 250 includes centering metal segments 250 on tracks T51 through T55 having a pitch M5P in the X direction. In various embodiments, arranging each metal segment 250 relative to one of tracks T51 through T55 includes aligning a given point along the width, e.g., a left or right edge, other than the center with the corresponding one of tracks T51 through T55. Pitch M5P is greater than each of pitches M2P, M3P, and M4P.

Each metal segment 250 defines a portion of a metal five layer in IC layout diagram 200 and overlies a via 250V. Each via 250V defines a conductive path from a metal segment 250 to a metal segment 240.

At operation 150, in some embodiments, an IC layout file is generated based on the IC layout diagram. In some embodiments, generating the IC layout file includes generating the IC layout file based on IC layout diagram 200 discussed above with respect to FIGS. 2A-2D.

In some embodiments, generating the IC layout file includes generating the IC layout file based on one or more layout diagrams 520 of IC layout diagram generation system 500 discussed below with respect to FIG. 5.

In some embodiments, generating the IC layout file includes generating one or more electronic files containing data, e.g., IC design layout diagram 622, usable by an IC manufacturing system as part of an IC manufacturing flow, e.g., IC manufacturing system 600, each discussed below with respect to FIG. 6.

At operation 160, in some embodiments, a set of masks is generated based on the IC layout diagram. The sets of masks is usable to manufacture one or more IC structures. In various embodiments, generating the set of masks includes performing one or more additional manufacturing operations, non-limiting examples of which include generating one or more files representing the IC layout diagram, storing the one or more files in a storage device or database, or transmitting the one or more files over a network.

In various embodiments, generating the set of masks includes performing one or more manufacturing operations using processor 502 of IC layout diagram generation system 500, discussed below with respect to FIG. 5.

In various embodiments, generating the set of masks includes performing one or more manufacturing operations by an IC manufacturing system as part of an IC manufacturing flow, e.g., IC manufacturing system 600, discussed below with respect to FIG. 6. In various embodiments, generating the set of masks is part of manufacturing an IC structure, e.g., IC structure 300 discussed below with respect to FIGS. 3A-3C, in which metal segments are arranged by including a third pitch smaller than a second pitch.

In FIG. 2E, values of the ratio of layout diagram feature height to the first pitch, discussed above with respect to operation 110, are displayed on the x-axis, and utilization values are displayed on the y-axis.

Utilization is a quantified representation of the efficiency of a layout diagram of a given circuit relative to available space. In the embodiment depicted in FIG. 2E, utilization is expressed as a percentage based on a first area representing layout diagram feature usage and a second area representing total usable space. In various embodiments, utilization is expressed in another form, e.g., a different percentage or a normalized value, capable of representing layout diagram efficiency.

In various embodiments, the first area is an aggregate of the areas occupied by some or all of the layout diagram features, e.g., cells 210A and/or 210B, of the given circuit, and the second area is the usable space of some or all of a specific section, e.g., a core section, of an IC device in which the given circuit is located.

FIG. 2E depicts two relationships, R1 and R2, between ratio and utilization values, in accordance with some embodiments. As discussed above with respect to operation 110, as the ratio values decrease, a number of metal segments of the first plurality of metal segments capable of overlapping a given layout diagram feature decreases, and options for routing electrical connections to/from the layout diagram features become limited. Accordingly, each of relationships R1 and R2 has a positive slope, indicating that utilization decreases as the ratio values decrease and increases as the ratio values increase.

In relationship R1, a ratio value of 3 corresponds to a utilization value UT1, and a ratio value of 7 corresponds to a utilization value UT3. In relationship R2, the ratio value of 3 corresponds to a utilization value UT2 greater than utilization value UT1, and the ratio value of 7 corresponds to a utilization value UT4 greater than utilization value UT3.

Relationship R2 represents a case in which the third plurality of metal segments has a pitch smaller than the pitch of the second plurality of metal segments in accordance with executing one or more operations of method 100. In some embodiments, the second pitch is greater than or equal to a value of 1.25 times the third pitch, as discussed above with respect to operation 130. Relationship R1 represents an approach in which a third plurality of metal segments has a pitch larger than a pitch of a second plurality of metal segments.

As depicted in FIG. 2E, for a given ratio of layout diagram feature height to first pitch, utilization based on relationship R2 is greater than utilization based on relationship R1, reflecting increased routing flexibility based on the third plurality of metal segments having a pitch smaller than the pitch of the second plurality of metal segments in accordance with executing one or more operations of method 100.

In the embodiment depicted in FIG. 2E, the utilization increase based on relationship R2 relative to relationship R1 increases as the ratio values decrease, reflecting increased significance as layout diagram feature height decreases relative to the first pitch.

In some embodiments, for a given ratio of layout diagram feature height to first pitch, e.g., 3, or 7, the utilization increase based on relationship R2 relative to relationship R1, e.g., UT4-UT3 or UT2-UT1, has a value ranging from 1 percent to 5 percent. In some embodiments, for a given ratio of layout diagram feature height to first pitch, the utilization increase based on relationship R2 relative to relationship R1 has a value ranging from 2 percent to 4 percent.

By executing the operations of method 100, an IC layout diagram, e.g., IC layout diagram 200, is generated in which the third plurality of metal segments has a pitch smaller than the pitch of the second plurality of metal segments. Because of the relatively smaller pitch, the third plurality of metal segments is capable of having greater routing flexibility than pluralities of metal segments in approaches in which a pitch is not smaller than the pitch of a lower metal layer. Compared to approaches without a relatively smaller pitch, the greater flexibility enables increased utilization of chip area by allowing more compact arrangements of layout diagram features such as standard cells.

As cell heights become smaller relative to the pitch of a first metal layer overlying cells in an IC layout diagram, the effect of routing flexibility on chip area utilization increases. Thus, the benefits of relatively greater flexibility and increased utilization are particularly important in layout diagrams in which the relatively smaller pitch is in the direction of the height of a cell and in which the cell height is limited to five times the pitch of the first metal layer.

Figure 4:
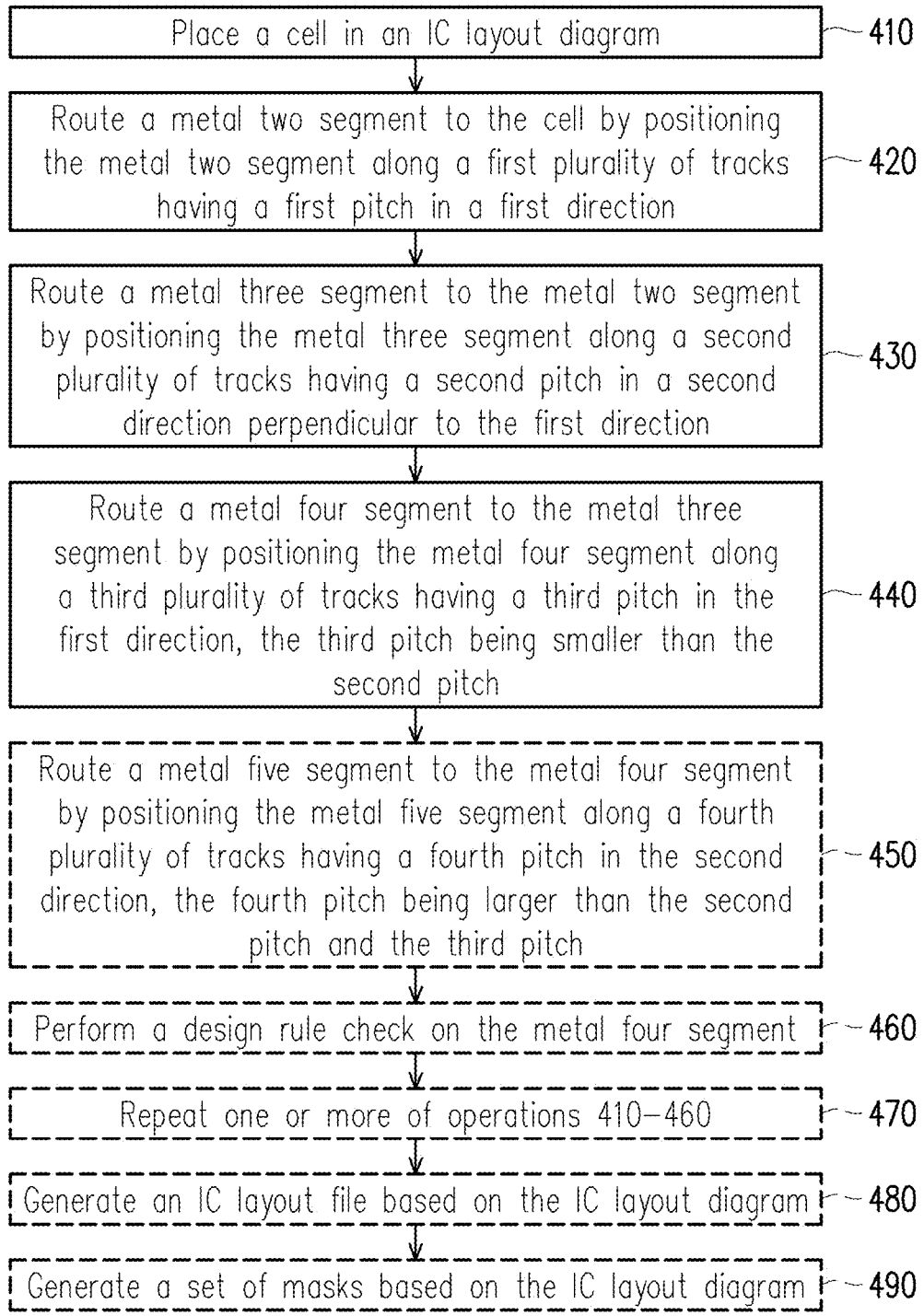
FIG. 4 is a flowchart of a method of routing connections to a cell, in accordance with some embodiments.

In embodiments in which a main routing layer includes metal layers in which the third pitch is smaller than the second pitch, the increased routing flexibility is also capable of reducing violations during design rule checks, e.g., operation 460 discussed below with respect to method 400 and FIG. 4, compared to approaches in which a main routing layer includes metal layers in which the third pitch is not smaller than the second pitch. In some embodiments, a number of design rule check violations is reduced by up to a factor of ten for a main routing layer including metal layers in which the third pitch is smaller than the second pitch compared to a main routing layer including metal layers in which the third pitch is not smaller than the second pitch.

Figure 3A:
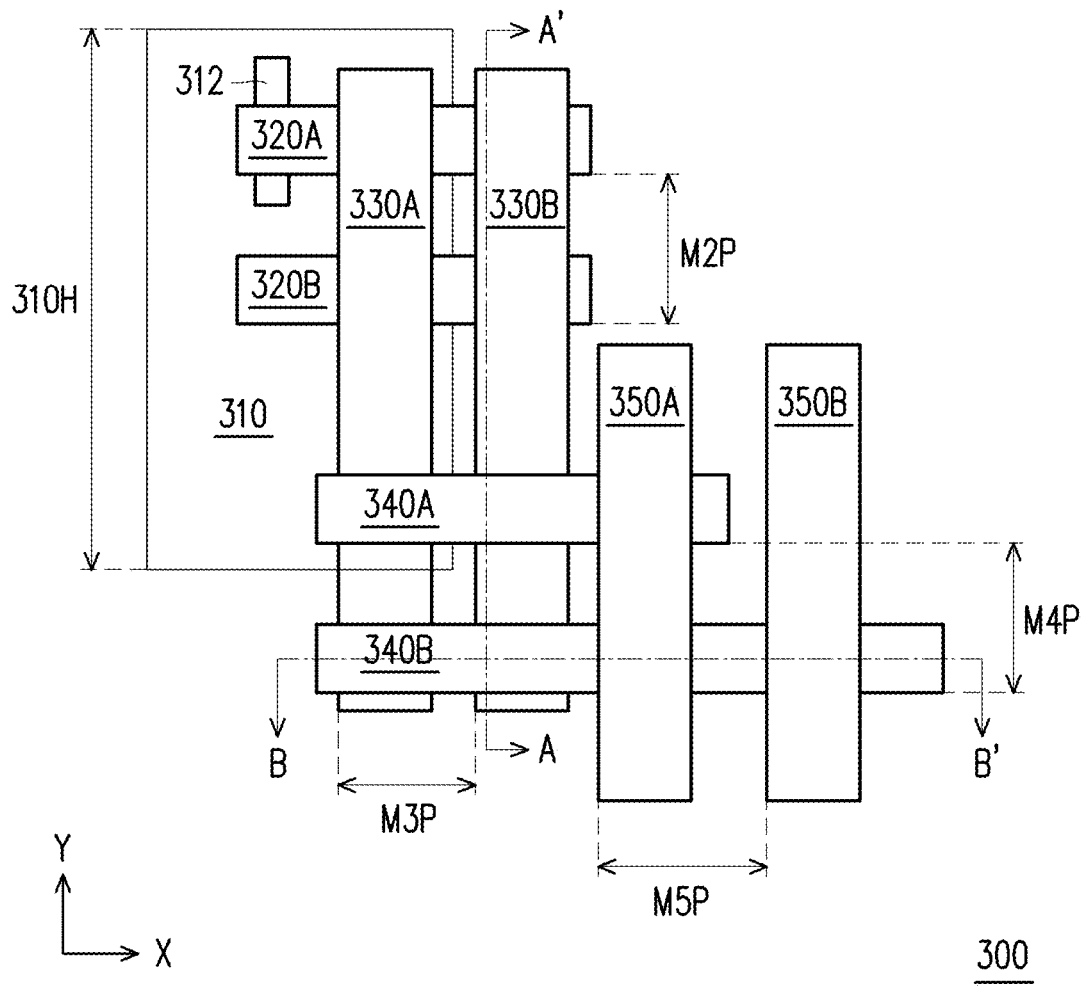
FIGS. 3A-3C are diagrams of an IC structure, in accordance with some embodiments.
Figure 3B:
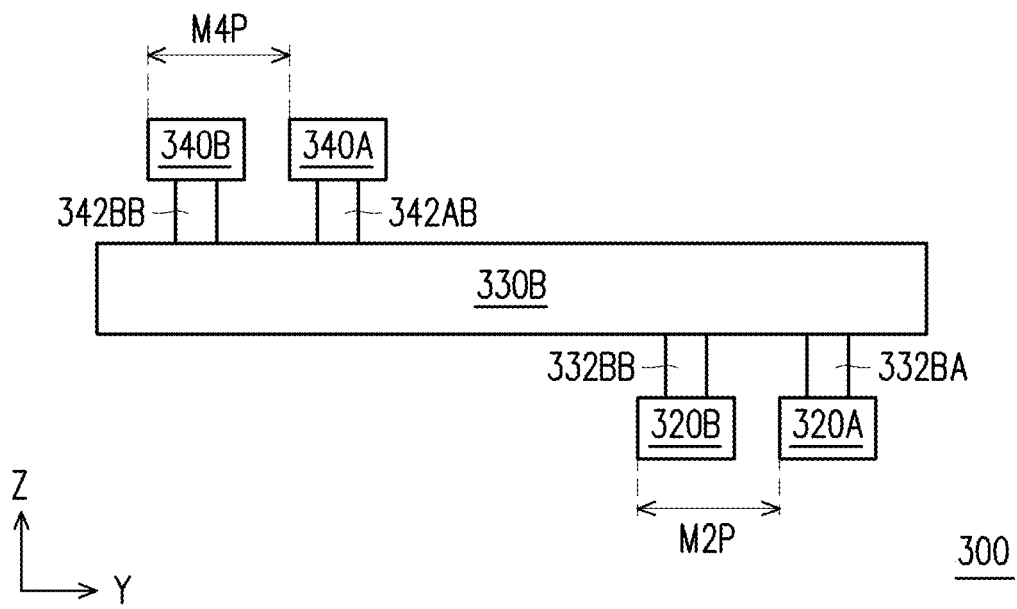
Figure 3C:
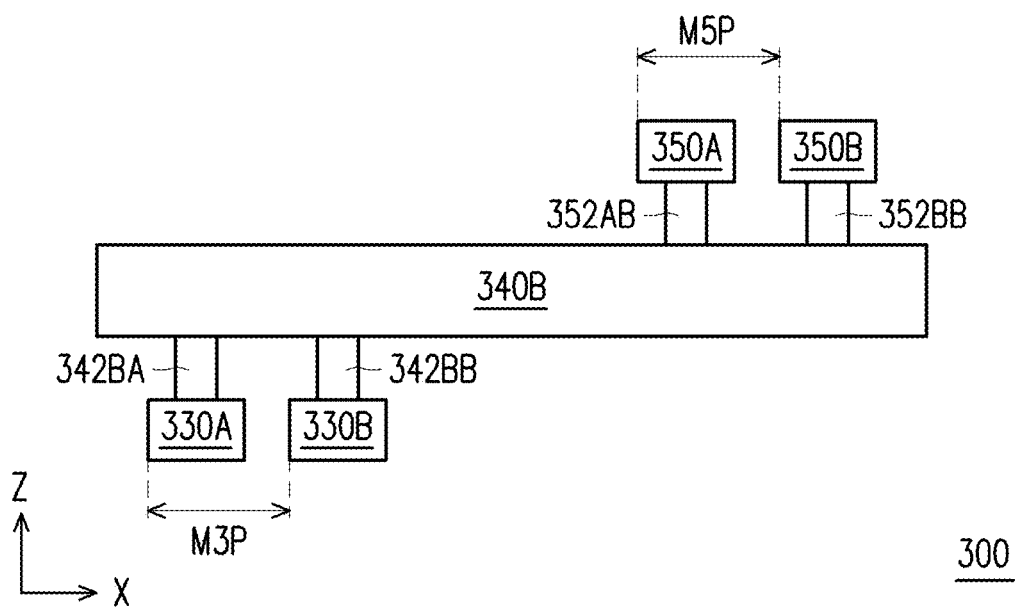

FIGS. 3A-3C are diagrams of an IC structure 300, in accordance with some embodiments. IC structure 300 is a non-limiting example of an IC structure formed by executing some or all of the operations of methods 100 and 400, discussed herein with respect to FIGS. 1 and 4. In various embodiments, IC structures formed by executing some or all of the operations of methods 100 and 400 include a subset of the features depicted in FIGS. 3A-3C, features in addition to those depicted in FIGS. 3A-3C, or features having configurations that differ from those depicted in FIGS. 3A-3C.

The depictions of IC structure 300 in FIGS. 3A-3C are simplified for the purpose of clarity, with various features included and excluded to facilitate the discussion below. FIG. 3A depicts a plan view of IC structure 300, and directions X and Y. FIG. 3B depicts a cross-sectional view of IC structure 300 along line A-A' in FIG. 3A, direction Y and a direction Z. FIG. 3C depicts a cross-sectional view of IC structure 300 along line B-B' in FIG. 3A, and directions X and Z.

IC structure 300 includes an IC feature 310, metal segments 320A and 320B overlying IC feature 310, metal segments 330A and 330B overlying metal segments 320A and 320B, metal segments 340A and 340B overlying metal segments 330A and 330B, a metal segment 350A overlying metal segments 340A and 340B, and a metal segment 350B overlying metal segment 340B.

IC feature 310 corresponds to an IC feature discussed above with respect to method 100 and FIGS. 1 and 2A, has a height 310H in the Y direction, and includes a conductive element 312. In various embodiments, IC feature 310 includes one or more semiconductor or other IC structures (not shown) and conductive element 312 is configured to provide an electrical connection to the one or more semiconductor or other IC structures.

In the embodiment depicted in FIG. 3A, conductive element 312 is a single metal segment positioned in a metal one layer. In various embodiments, conductive element 312 is a metal segment positioned in a metal zero layer of IC feature 310 or a polysilicon or active region in IC feature 310.

In some embodiments, conductive element 312 is one conductive element of a plurality of conductive elements in IC feature 310. In various embodiments, a plurality of conductive elements in IC feature 310 includes one or more conductive elements positioned in one or more of a metal one layer, a metal zero layer, or a polysilicon or active region in IC feature 310.

In the embodiment depicted in FIG. 3A, conductive element 312 has a rectangular shape and a length in the Y direction. In various embodiments, conductive element 312 has a length in the X direction or has a shape other than a rectangular shape, e.g., a square or L-shape.

Metal segments 320A and 320B have a pitch M2P in the Y direction. In the embodiment depicted in FIGS. 3A and 3B, metal segments 320A and 320B have a same width and pitch M2P corresponds to a first edge along the widths of metal segments 320A and 320B. In various embodiments, pitch M2P corresponds to a point along widths of metal segments 320A and 320B other than the first edge, and/or metal segment 320A has a width different from a width of metal segment 320B.

In the embodiment depicted in FIGS. 3A and 3B, metal segments 320A and 320B both overlie IC feature 310, are positioned in a metal two layer, and have a spacing in the Y direction corresponding to a smallest spacing determined by pitch M2P. In various embodiments, one of metal segments 320A or 320B does not overlie IC feature 310, metal segments 320A and 320B are positioned in a metal layer other than the metal two layer, and/or metal segments 320A and 320B have a spacing in the Y direction determined by pitch M2P but corresponding to a spacing other than the smallest spacing determined by pitch M2P.

Metal segments 330A and 330B have a pitch M3P in the X direction. In the embodiment depicted in FIGS. 3A and 3C, metal segments 330A and 330B have a same width and pitch M3P corresponds to a first edge along the widths of metal segments 330A and 330B. In various embodiments, pitch M3P corresponds to a point along widths of metal segments 330A and 330B other than the first edge, and/or metal segment 330A has a width different from a width of metal segment 330B.

In the embodiment depicted in FIGS. 3A-3C, metal segments 330A and 330B both overlie metal segments 320A and 320B, are positioned in a metal three layer, and have a spacing in the X direction corresponding to a smallest spacing determined by pitch M3P. In various embodiments, one of metal segments 330A or 330B does not overlie one or both of metal segments 320A or 320B, metal segments 330A and 330B are positioned in a metal layer other than the metal three layer, and/or metal segments 330A and 330B have a spacing in the X direction determined by pitch M3P but corresponding to a spacing other than the smallest spacing determined by pitch M3P.

As depicted in FIG. 3B, metal segment 330B is electrically connected to metal segment 320A by a via 332BA and electrically connected to metal segment 320B by a via 332BB. In some embodiments, IC structure 300 does not include one of vias 332BA or 332BB, and metal segment 330B is electrically connected to only one of metal segments 320A or 320B.

Metal segments 340A and 340B have a pitch M4P in the Y direction. In the embodiment depicted in FIGS. 3A and 3B, metal segments 340A and 340B have a same width and pitch M4P corresponds to a first edge along the widths of metal segments 340A and 340B. In various embodiments, pitch M4P corresponds to a point along widths of metal segments 340A and 340B other than the first edge, and/or metal segment 340A has a width different from a width of metal segment 340B.

In the embodiment depicted in FIGS. 3A-3C, metal segments 340A and 340B both overlie metal segments 330A and 330B, are positioned in a metal four layer, and have a spacing in the Y direction corresponding to a smallest spacing determined by pitch M4P. In various embodiments, one of metal segments 340A or 340B does not overlie one or both of metal segments 330A or 330B, metal segments 340A and 340B are positioned in a metal layer other than the metal four layer, and/or metal segments 340A and 340B have a spacing in the Y direction determined by pitch M4P but corresponding to a spacing other than the smallest spacing determined by pitch M4P.

As depicted in FIGS. 3B and 3C, metal segment 340A is electrically connected to metal segment 330B by a via 342AB, and metal segment 340B is electrically connected to metal segment 330A by a via 342BA and electrically connected to metal segment 330B by a via 342BB. In some embodiments, IC structure 300 does not include via 342AB, and metal segment 340A is not electrically connected to metal segment 330B. In some embodiments, IC structure 300 does not include one of vias 342BA or 342BB, and metal segment 340B is electrically connected to only one of metal segments 330A or 330B.

Metal segments 350A and 350B have a pitch M5P in the X direction. In the embodiment depicted in FIGS. 3A and 3C, metal segments 350A and 350B have a same width and pitch M5P corresponds to a first edge along the widths of metal segments 350A and 350B. In various embodiments, pitch M5P corresponds to a point along widths of metal segments 350A and 350B other than the first edge, and/or metal segment 350A has a width different from a width of metal segment 350B.

In the embodiment depicted in FIGS. 3A and 3C, metal segment 350A overlies metal segments 340A and 340B, metal segment 350B overlies metal segment 340A, metal segments 350A and 350B are positioned in a metal five layer, and have a spacing in the X direction corresponding to a smallest spacing determined by pitch M5P. In various embodiments, one of metal segments 350A or 350B does not overlie one or both of metal segments 340A or 340B, metal segments 350A and 350B are positioned in a metal layer other than the metal five layer, and/or metal segments 350A and 350B have a spacing in the X direction determined by pitch M5P but corresponding to a spacing other than the smallest spacing determined by pitch M5P.

As depicted in FIG. 3C, metal segment 350A is electrically connected to metal segment 340B by a via 352AB, and metal segment 350B is electrically connected to metal segment 340B by a via 352BB. In some embodiments, IC structure 300 does not include one of vias 352AB or 352BB, and only one of metal segments 350A or 350B is electrically connected to metal segment 340B.

In the embodiment depicted in FIGS. 3A-3C, each of vias 332BA, 332BB, 342AB, 342BA, 342BB, 352AB, and 352BB has dimensions in the X and Y directions that are equal to or smaller than corresponding dimensions of overlying or underlying metal segments. In various embodiments, one or more of vias 332BA, 332BB, 342AB, 342BA, 342BB, 352AB, or 352BB are configured as slot vias, thereby having one or more dimensions in the X and/or Y directions that are larger than corresponding dimensions of overlying or underlying metal segments.

Pitch M4P is smaller than pitch M3P. In some embodiments, a ratio of pitch M3P to pitch M4P is greater than or equal to 1.25, in accordance with the discussion above with respect to operation 130 of method 100 and FIG. 1.

Pitch M2P is smaller than each of pitches M3P, M4P, and M5P. In some embodiments, pitch M5P is larger than pitch M3P.

In various embodiments, IC structure 300 includes one or more metal segments (not shown) in metal layers above the metal layer in which metal segments 350A and 350B are positioned, and the one or more metal segments have pitches in the X and or Y direction that are larger than pitch M5P.

By being manufactured through execution of some or all of the operations of methods 100 and/or 400, discussed herein with respect to FIGS. 1 and 4, IC structure 300 having pitch M4P smaller than pitch M3P enables the realization of the advantages discussed above with respect to method 100.

FIG. 4 is a flowchart of a method 400 of routing connections to a cell, in accordance with some embodiments. The operations of method 400 are capable of being performed as part of a method of forming an IC structure, e.g., IC structure 300 discussed above with respect to FIGS. 3A-3C. In some embodiments, forming the IC structure is part of forming one or more semiconductor devices, non-limiting examples of which include memory circuits, logic devices, processing devices, signal processing circuits, and the like.

In some embodiments, some or all of method 400 is executed by a processor of a computer. In some embodiments, some or all of method 400 is executed by a processor 502 of an IC layout diagram generation system 500, discussed below with respect to FIG. 5.

Some or all of the operations of method 400 are capable of being performed as part of a design procedure performed in a design house, e.g., design house 620, discussed below with respect to FIG. 6.

Some or all of the operations of method 400 are capable of being performed as part of an APR method, e.g., an APR method performed by an APR system. In various embodiments, an APR method includes one or a combination of a constructive algorithm, an iterative algorithm, or an integrated algorithm.

In a constructive algorithm, operations of placing and routing are performed on a cell-by-cell basis. After an IC layout diagram has been updated to include placement of a given cell and its associated routing connections, an additional layout diagram revision includes placement of an additional cell and its associated routing connections.

In an iterative algorithm, an initial IC layout diagram including multiple cells and associated routing connections is iteratively analyzed and revised based on circuit performance and trade-off criteria.

In an integrated algorithm, circuit performance and trade-off criteria are applied as an IC layout diagram is being revised to include placement of a given cell and/or its routing connections.

In various embodiments, the operations of method 400 are performed in the order depicted in FIG. 4 or in one or more orders other than the order depicted in FIG. 4. In some embodiments, one or more additional operations are performed before, between, during, and/or after one or more operations of method 400.

At operation 410, in some embodiments, a cell is placed in in an IC layout diagram. In various embodiments, placing the cell in the IC layout diagram includes placing a standard cell, an engineering change order (ECO) cell, a logic cell, a memory cell, a custom cell, or a combination of cells. In some embodiments, placing the cell in the IC layout diagram includes placing one of cells 210A or 210B in IC layout diagram 200 discussed above with respect to FIGS. 1 and 2A.

The cell has a cell height in a first direction. In some embodiments, the cell is one cell of a plurality of cells, and each cell of the plurality of cells has the cell height. In some embodiments, the cell is one cell of a plurality of cells, and one or more cells of the plurality of cells has a height different from the cell height.

At operation 420, a metal two segment is routed to the cell by positioning the metal two segment along a first plurality of tracks having a first pitch in the first direction. In some embodiments, routing the metal two segment to the cell includes overlapping the cell with the metal two segment.

In some embodiments, a ratio of the cell height to the first pitch is equal to or less than five, in accordance with the discussion above with respect to method 100 and FIGS. 1 and 2E. In some embodiments, the first pitch is a first pitch of one or more pitches 522 of IC layout diagram generation system 500, discussed below with respect to FIG. 5.

Routing the metal two segment to the cell includes forming a pattern in a metal two layer of an IC manufacturing process. In various embodiments, routing the metal two segment to the cell includes forming one or more additional patterns configured to form one or more electrical connections, e.g., a via, a slot via, a contact, or a metal one or zero segment, between the cell and the metal two segment.

In some embodiments, the cell is one cell of a plurality of cells, the metal two segment is one metal two segment of a plurality of metal two segments, and routing the metal two segment to the cell includes routing each metal two segment of the plurality of metal two segments to a corresponding cell of the plurality of cells.

In some embodiments, routing the metal two segment to the cell includes arranging metal segment 220 in IC layout diagram 200 discussed above with respect to FIGS. 1 and 2A.

At operation 430, a metal three segment is routed to the metal two segment by positioning the metal three segment along a second plurality of tracks having a second pitch in a second direction perpendicular to the first direction. In some embodiments, routing the metal three segment to the metal two segment includes overlapping the metal two segment with the metal three segment.

In some embodiments, the second pitch is a second pitch of one or more pitches 522 of IC layout diagram generation system 500, discussed below with respect to FIG. 5.

Routing the metal three segment to the metal two segment includes forming a pattern in a metal three layer of an IC manufacturing process. In various embodiments, routing the metal three segment to the metal two segment includes forming one or more additional patterns configured to form one or more electrical connections, e.g., a via or a slot via, between the metal two segment and the metal three segment.

In some embodiments, the metal two segment is one metal two segment of a plurality of metal two segments, the metal three segment is one metal three segment of a plurality of metal three segments, and routing the metal three segment to the metal two segment includes routing each metal three segment of the plurality of metal three segments to a corresponding metal two segment of the plurality of metal two segments.

In some embodiments, routing the metal three segment to the metal two segment includes arranging a metal segment 230 in IC layout diagram 200 discussed above with respect to FIGS. 1 and 2B.

At operation 440, a metal four segment is routed to the metal three segment by positioning the metal four segment along a third plurality of tracks having a third pitch in the first direction. In some embodiments, routing the metal four segment to the metal three segment includes overlapping the metal three segment with the metal four segment.

The third pitch is smaller than the second pitch. In some embodiments, a ratio of the second pitch to the third pitch is greater than or equal to 1.25, in accordance with the discussion above with respect to operation 130 of method 100 and FIG. 1. In various embodiments, the third pitch is smaller than, equal to, or larger than the first pitch. In some embodiments, the third pitch is a third pitch of one or more pitches 522 of IC layout diagram generation system 500, discussed below with respect to FIG. 5.

Routing the metal four segment to the metal three segment includes forming a pattern in a metal four layer of an IC manufacturing process. In various embodiments, routing the metal four segment to the metal three segment includes forming one or more additional patterns configured to form one or more electrical connections, e.g., a via or a slot via, between the metal three segment and the metal four segment.

In some embodiments, the metal three segment is one metal three segment of a plurality of metal three segments, the metal four segment is one metal four segment of a plurality of metal four segments, and routing the metal four segment to the metal three segment includes routing each metal four segment of the plurality of metal four segments to a corresponding metal three segment of the plurality of metal three segments.

In some embodiments, routing the metal four segment to the metal three segment includes arranging a metal segment 240 in IC layout diagram 200 discussed above with respect to FIGS. 1 and 2C.

At operation 450, in some embodiments, a metal five segment is routed to the metal four segment by positioning the metal five segment along a fourth plurality of tracks having a fourth pitch in the second direction. In some embodiments, routing the metal five segment to the metal four segment includes overlapping the metal four segment with the metal five segment.

In some embodiments, the fourth pitch is larger than the second pitch and the third pitch. In some embodiments, a ratio of the fourth pitch to the third pitch is equal to or greater than 1.3. In various embodiments, the fourth pitch is smaller than, equal to, or larger than one or both of the first pitch or the second pitch. In some embodiments, the fourth pitch is a fourth pitch of one or more pitches 522 of IC layout diagram generation system 500, discussed below with respect to FIG. 5.

Routing the metal five segment to the metal four segment includes forming a pattern in a metal five layer of an IC manufacturing process. In various embodiments, routing the metal five segment to the metal four segment includes forming one or more additional patterns configured to form one or more electrical connections, e.g., a via or a slot via, between the metal four segment and the metal five segment.

In some embodiments, the metal four segment is one metal four segment of a plurality of metal four segments, the metal five segment is one metal five segment of a plurality of metal five segments, and routing the metal five segment to the metal four segment includes routing each metal three segment of the plurality of metal five segments to a corresponding metal four segment of the plurality of metal four segments.

In some embodiments, routing the metal five segment to the metal four segment includes arranging a metal segment 250 in IC layout diagram 200 discussed above with respect to FIGS. 1 and 2D.

At operation 460, in some embodiments, a design rule check is performed on the metal four segment. In some embodiments, performing the design rule check includes performing an evaluation based on a spacing between the metal four segment and another conductive feature of the IC layout diagram. In some embodiments, the metal four segment is one metal four segment of a plurality of metal four segments, and performing a design rule check includes performing an evaluation based on a spacing between multiple metal four segments of the plurality of metal four segments.

In some embodiments, performing the design rule check includes determining that the routing of the metal four metal segment violates a design rule. In some embodiments, violating the design rule includes the metal four segment and an adjacent segment having a spacing less than a minimum end-to-end spacing. In some embodiments, violating the design rule includes the metal four segment being part of a first signal path, an adjacent segment being part of a second signal path, and the metal four segment being shorted to the adjacent metal segment.

In some embodiments, the design rule check is one design rule check of a plurality of design rule checks, and performing the design rule check includes performing the plurality of design rule checks.

At operation 470, in some embodiments, one or more of operations 410-460 is repeated. In some embodiments, repeating one or more of operations 410-460 is part of performing an APR method. In some embodiments, repeating one or more of operations 410-460 is part of performing an APR method including one or a combination of a constructive algorithm, an iterative algorithm, or an integrated algorithm.

In some operations, repeating one or more of operations 410-460 includes revising an IC layout diagram based on the repeating the one or more of operations 410-460.

At operation 480, in some embodiments, an IC layout file is generated based on the IC layout diagram. In some embodiments, generating the IC layout file includes generating the IC layout file based on one or more layout diagrams 520 of IC layout diagram generation system 500, discussed below with respect to FIG. 5.

In some embodiments, generating the IC layout file includes generating one or more electronic files containing data usable by an IC manufacturing system as part of an IC manufacturing flow, e.g., IC manufacturing system 600, discussed below with respect to FIG. 6.

At operation 490, in some embodiments, a set of masks is generated based on the IC layout diagram. The sets of masks is usable to manufacture one or more IC structures. In various embodiments, generating the set of masks includes performing one or more manufacturing operations using processor 502 of IC layout diagram generation system 500, discussed below with respect to FIG. 5.

In various embodiments, generating the set of masks includes performing one or more manufacturing operations using an IC manufacturing system as part of an IC manufacturing flow, e.g., IC manufacturing system 600, discussed below with respect to FIG. 6. In various embodiments, generating the set of masks is part of manufacturing an IC structure, e.g., IC structure 300 discussed above with respect to FIGS. 3A-3C, in which the electrical connections to a cell include a third pitch smaller than a second pitch.

By executing the operations of method 400, an IC layout diagram, e.g., IC layout diagram 200, is generated in which the third pitch is smaller than the second pitch. Because of the relatively smaller pitch, the routing of the metal two, three, and four segments to the cell is capable of having greater flexibility than routing in approaches in which a pitch is not smaller than the pitch of a lower metal layer. Compared to approaches without a relatively smaller pitch, the greater flexibility enables the benefits discussed above with respect to method 100.

Figure 5:
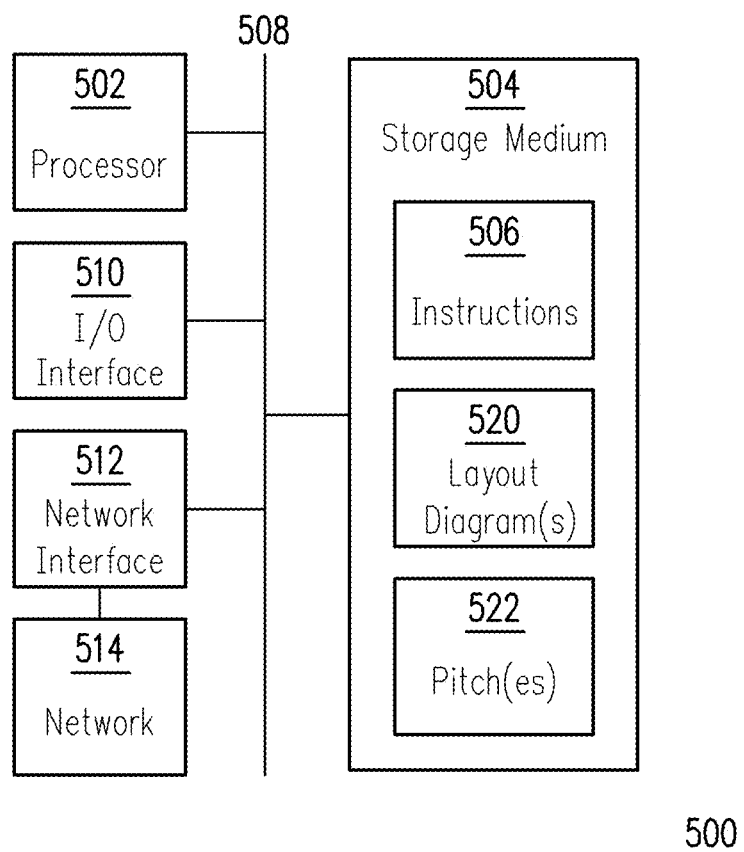
FIG. 5 is a schematic view of an IC layout diagram generation system, in accordance with some embodiments.

FIG. 5 is a schematic view of an IC layout diagram generation system 500, in accordance with some embodiments. In some embodiments, IC layout diagram generation system 500 is usable as part of a design house 620 of an IC manufacturing system 600, discussed below with respect to FIG. 6. In some embodiments, IC layout diagram generation system 500 is an APR system, includes an APR system, or is part of an APR system, usable for performing an APR method.

In some embodiments, IC layout diagram generation system 500 is capable of performing some or all of the operations of method 100, discussed above with respect to FIG. 1, and/or some or all of method 400, discussed above with respect to FIG. 4.

IC layout diagram generation system 500 includes a hardware processor 502 and a non-transitory, computer readable storage medium 504 encoded with, i.e., storing, the computer program instructions 506, i.e., a set of executable instructions. Instructions 506 include instructions for generating IC layout diagrams for an IC manufacturing system. The processor 502 is electrically coupled with the computer readable storage medium 504 via a bus 508. The processor 502 is also electrically coupled with an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program instructions 506 encoded in the computer readable storage medium 504 in order to cause IC layout diagram generation system 500 to be usable for performing a portion or all of the operations as described in methods 100 and 400.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device) for storing instructions and/or data in a non-transitory manner. For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the computer readable storage medium 504 stores the computer program instructions 506 configured to cause IC layout diagram generation system 500 to perform a portion or all of methods 100 and 400. In some embodiments, the computer readable storage medium 504 also stores information needed for performing methods 100, and/or 400 as well as information generated during the performance of the methods 100 and/or 400, such as one or more layout diagrams 520, one or more pitches 522, and/or instructions 506 to perform one or more operations of methods 100 and 400.

I/O interface 510 is coupled with external circuitry. In some embodiments, I/O interface 510 includes a keyboard, keypad, mouse, trackball, trackpad, and/or cursor direction keys for communicating information and/or commands to processor 502. In some embodiments, I/O interface 510 includes a display, signal light, and/or audio device for communicating information from processor 502.

Network interface 512 allows IC layout diagram generation system 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394. In some embodiments, one or both of methods 100 or 400 is implemented in two or more IC layout diagram generation systems 500, and information such as one or more layout diagrams 520 or one or more pitches 522 are exchanged between different systems 500 via network 514.

IC layout diagram generation system 500 is configured to receive information related to generating IC layout diagrams. The information is transferred to processor 502 via bus 508 and is then stored in computer readable storage medium 504 as one or more layout diagrams 520, one or more pitches 522, or instructions 506. In some embodiments, the one or more layout diagrams 520 are accessed in method 100 (FIG. 1) and/or method 400 (FIG. 4). In some embodiments, the one or more pitches 522 are accessed in method 100 (FIG. 1) and/or method 400 (FIG. 4).

By being configured to execute a portion or all of methods 100 and 400, IC layout diagram generation system 500 enables the realization of the advantages discussed above with respect to methods 100 and 400, and FIGS. 1-4.

Figure 6:
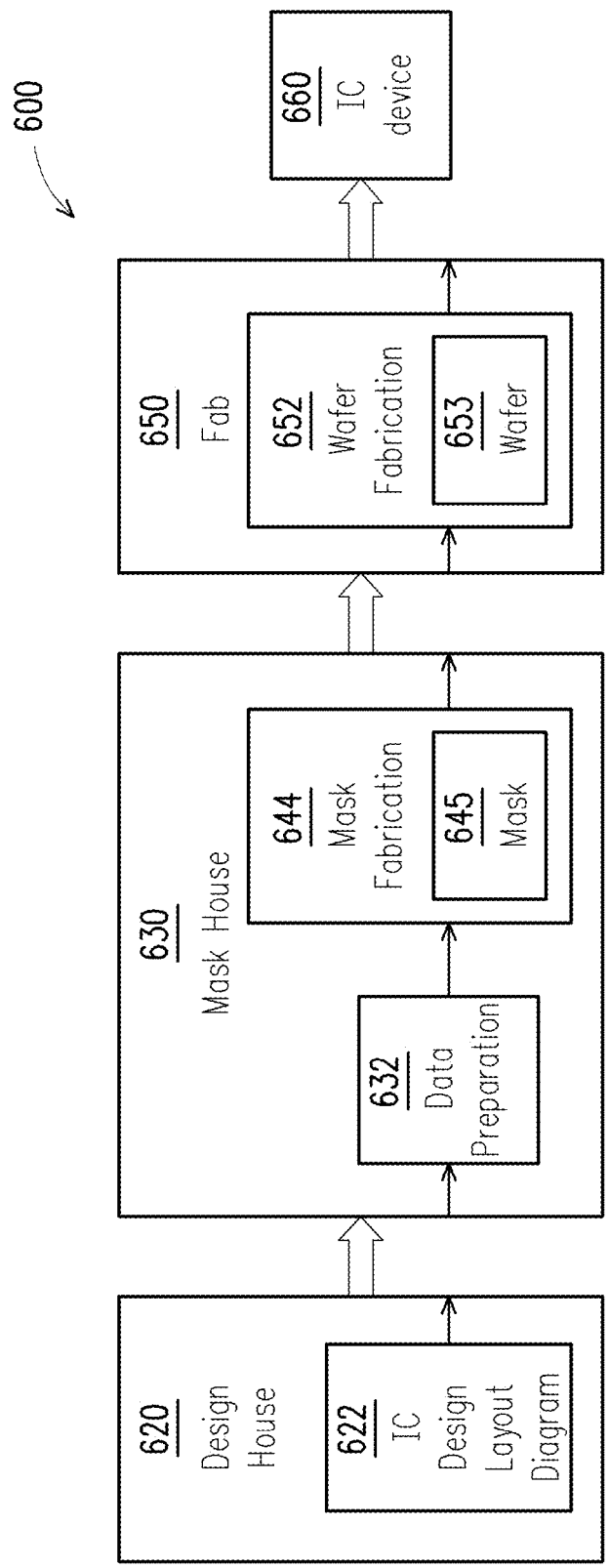
FIG. 6 is a depiction of an IC manufacturing system and an IC manufacturing flow associated therewith, in accordance with some embodiments.

FIG. 6 is a block diagram of IC manufacturing system 600, and an IC manufacturing flow associated therewith, in accordance with some embodiments.

In general, system 600 generates a layout diagram (e.g., any one of IC layout diagram 200, discussed above with respect to FIGS. 1-4, or the like). Based on the layout diagram, system 600 fabricates at least one of (A) one or more semiconductor masks or (B) at least one component in a layer of an inchoate semiconductor integrated circuit.

In FIG. 6, IC manufacturing system 600 includes entities, such as design house 620, a mask house 630, and an IC manufacturer/fabricator ("fab") 650, that interact with one another in the design, development, and manufacturing cycles and/or services related to manufacturing an IC device 660. The entities in system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 620, mask house 630, and IC fab 650 is owned by a single larger company. In some embodiments, two or more of design house 620, mask house 630, and IC fab 650 coexist in a common facility and use common resources.

Design house (or design team) 620 generates an IC design layout diagram 622. IC design layout diagram 622 includes various geometrical patterns designed for an IC device 660. The geometrical patterns correspond to patterns of metal, oxide, or semiconductor layers that make up the various components of IC device 660 to be fabricated. The various layers combine to form various IC features. For example, a portion of IC design layout diagram 622 includes various IC features, such as an active area, gate electrode, source and drain, metal lines or vias of an interlayer interconnection, and openings for bonding pads, to be formed in a semiconductor substrate (such as a silicon wafer) and various material layers disposed on the semiconductor substrate. Design house 620 implements a proper design procedure to form IC design layout diagram 622. The design procedure includes one or more of logic design, physical design or place and route, e.g., an APR method performed by an APR system. IC design layout diagram 622 is presented in one or more data files having information of the geometrical patterns. For example, IC design layout diagram 622 can be expressed in a GDSII file format or DFII file format.

Mask house 630 includes data preparation 632 and mask fabrication 644. Mask house 630 uses IC design layout diagram 622 to manufacture one or more masks 645 to be used for fabricating the various layers of IC device 660 according to IC design layout diagram 622. Mask house 630 performs mask data preparation 632, where IC design layout diagram 622 is translated into a representative data file ("RDF"). Mask data preparation 632 provides the RDF to mask fabrication 644. Mask fabrication 644 includes a mask writer. A mask writer converts the RDF to an image on a substrate, such as a mask (reticle) 645 or a semiconductor wafer 653. The design layout diagram is manipulated by mask data preparation 632 to comply with particular characteristics of the mask writer and/or requirements of IC fab 650. In FIG. 6, mask data preparation 632 and mask fabrication 644 are illustrated as separate elements. In some embodiments, mask data preparation 632 and mask fabrication 644 can be collectively referred to as mask data preparation.

In some embodiments, mask data preparation 632 includes optical proximity correction (OPC) which uses lithography enhancement techniques to compensate for image errors, such as those that can arise from diffraction, interference, other process effects or the like. OPC adjusts IC design layout diagram 622. In some embodiments, mask data preparation 632 includes further resolution enhancement techniques (RET), such as off-axis illumination, sub-resolution assist features, phase-shifting masks, other suitable techniques, or the like or combinations thereof. In some embodiments, inverse lithography technology (ILT) is also used, which treats OPC as an inverse imaging problem.

In some embodiments, mask data preparation 632 includes a mask rule checker (MRC) that checks the IC design layout diagram that has undergone processes in OPC with a set of mask creation rules which contain certain geometric and/or connectivity restrictions to ensure sufficient margins, to account for variability in semiconductor manufacturing processes, or the like. In some embodiments, the MRC modifies the IC design layout diagram to compensate for limitations during mask fabrication 644, which may undo part of the modifications performed by OPC in order to meet mask creation rules.

In some embodiments, mask data preparation 632 includes lithography process checking (LPC) that simulates processing that will be implemented by IC fab 650 to fabricate IC device 660. LPC simulates this processing based on IC design layout diagram 622 to create a simulated manufactured device, such as IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, or the like or combinations thereof. In some embodiments, after a simulated manufactured device has been created by LPC, if the simulated device is not close enough in shape to satisfy design rules, OPC and/or MRC are be repeated to further refine IC design layout diagram 622.

It should be understood that the above description of mask data preparation 632 has been simplified for the purpose of clarity. In some embodiments, data preparation 632 includes additional features such as a logic operation (LOP) to modify the IC design layout diagram according to manufacturing rules. Additionally, the processes applied to IC design layout diagram 622 during data preparation 632 may be executed in a variety of different orders.

After mask data preparation 632 and during mask fabrication 644, a mask 645 or a group of masks 645 are fabricated based on the modified IC design layout diagram. In some embodiments, an electron-beam (e-beam) or a mechanism of multiple e-beams is used to form a pattern on a mask (photomask or reticle) 645 based on the modified IC design layout diagram. The mask 645 can be formed in various technologies. In some embodiments, the mask 645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 645 includes a transparent substrate (e.g., fused quartz) and an opaque material (e.g., chromium) coated in the opaque regions of the mask. In another example, mask 645 is formed using a phase shift technology. In a phase shift mask (PSM) version of mask 645, various features in the pattern formed on the mask are configured to have proper phase difference to enhance the resolution and imaging quality. In various examples, the phase shift mask can be attenuated PSM or alternating PSM. The mask(s) generated by mask fabrication 644 is used in a variety of processes. For example, such a mask(s) is used in an ion implantation process to form various doped regions in semiconductor wafer 653, in an etching process to form various etching regions in semiconductor wafer 653, and/or in other suitable processes.

IC fab 650 is an IC fabrication business that includes one or more manufacturing facilities for the fabrication of a variety of different IC products. In some embodiments, IC Fab 650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 650 uses the mask (or masks) 645 fabricated by mask house 630 to fabricate IC device 660. Thus, IC fab 650 at least indirectly uses IC design layout diagram 622 to fabricate IC device 660. In some embodiments, semiconductor wafer 653 is fabricated by IC fab 650 using the mask (or masks) 645 to form IC device 660. Semiconductor wafer 653 includes a silicon substrate or other proper substrate having material layers formed thereon. Semiconductor wafer 653 further includes one or more of various doped regions, dielectric features, multilevel interconnects, or the like (formed at subsequent manufacturing steps).

Details regarding an integrated circuit (IC) manufacturing system (e.g., system 600, discussed above with respect to FIG. 6), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an IC structure includes a first plurality of metal segments positioned in a first metal layer, each metal segment of the first plurality of metal segments extending in a first direction, a second plurality of metal segments positioned in a second metal layer overlying the first metal layer, each metal segment of the second plurality of metal segments extending in a second direction perpendicular to the first direction, and a third plurality of metal segments positioned in a third metal layer overlying the second metal layer, each metal segment of the third plurality of metal segments extending in the first direction. A pitch of the third plurality of metal segments is smaller than a pitch of the second plurality of metal segments. In some embodiments, each of the pitch of the second plurality of metal segments and the pitch of the third plurality of metal segments is larger than the pitch of the first plurality of metal segments. In some embodiments, a fourth plurality of metal segments is positioned in a fourth metal layer overlying the third metal layer, each metal segment of the fourth plurality of metal segments extending in the second direction, wherein a pitch of the fourth plurality of metal segments is larger than the pitch of the second plurality of metal segments. In some embodiments, a metal segment of the first plurality of metal segments overlies a metal segment of a metal one layer. In some embodiments, the first metal layer is a metal two layer, the second metal layer is a metal three layer, and the third metal layer is a metal four layer. In some embodiments, a ratio of the pitch of the second plurality of metal segments to the pitch of the third plurality of metal segments is greater than or equal to 1.25. In some embodiments, the IC structure includes a slot via between a metal segment of the second plurality of metal segments and a metal segment of the third plurality of metal segments.

In some embodiments, a method of generating a layout diagram of an IC includes arranging a plurality of metal two segments in a metal two layer, a metal two segment of the plurality of metal two segments overlapping a cell in the IC layout diagram, and the plurality of metal two segments having a first pitch in a first direction. The method also includes arranging a plurality of metal three segments in a metal three layer, the plurality of metal three segments having a second pitch in a second direction perpendicular to the first direction, and arranging a plurality of metal four segments in a metal four layer, the plurality of metal four segments having a third pitch in the first direction. The third pitch is smaller than the second pitch, and at least one of the arranging the plurality of metal two segments, arranging the plurality of metal three segments, or arranging the plurality of metal four segments is executed by a processor of a computer. In some embodiments, a metal two segment of the plurality of metal two segments overlaps a metal one segment in the cell. In some embodiments, a ratio of a height of the cell in the first direction to the first pitch is equal to or less than five. In some embodiments, the cell is one cell of a plurality of cells, and the arranging the plurality of metal two segments in the metal two layer includes at least one metal two segment of the plurality of metal two segments overlapping each cell of the plurality of cells. In some embodiments, a ratio of the second pitch to the third pitch is greater than or equal to 1.25. In some embodiments, the method further includes generating an IC layout file based on the layout diagram. In some embodiments, the method further includes generating a set of masks based on the layout diagram.

In some embodiments, an IC layout diagram generation system includes a processor and a non-transitory, computer readable storage medium including computer program code for one or more programs. The non-transitory, computer readable storage medium and the computer program code are configured to, with the processor, cause the system to place a cell in an IC layout diagram, route a metal two segment to the cell by positioning the metal two segment along a first plurality of tracks having a first pitch in a first direction, route a metal three segment to the metal two segment by positioning the metal three segment along a second plurality of tracks having a second pitch in a second direction perpendicular to the first direction, route a metal four segment to the metal three segment by positioning the metal four segment along a third plurality of tracks having a third pitch in the first direction, and generate an IC layout file based on the cell, the metal two segment, the metal three segment, and the metal four segment, the third pitch being smaller than the second pitch. In some embodiments, the cell has a cell height in the first direction, and a ratio of the cell height to the first pitch is equal to or less than five. In some embodiments, the non-transitory, computer readable storage medium and the computer program code are configured to, with the processor, further cause the system to route a metal five segment to the metal four segment by positioning the metal five segment along a fourth plurality of tracks having a fourth pitch in the second direction, wherein the fourth pitch is larger than the second pitch and the third pitch. In some embodiments, the cell is one cell of a plurality of cells, and the non-transitory, computer readable storage medium and the computer program code are configured to, with the processor, further cause the system to place the plurality of cells in the IC layout diagram based on routing of each of a plurality of metal two segments comprising the metal two segment, a plurality of metal three segments comprising the metal three segment, and a plurality of metal four segments comprising the metal four segment. In some embodiments, the non-transitory, computer readable storage medium and the computer program code are configured to, with the processor, further cause the system to perform a design rule check on the metal four segment. In some embodiments, the non-transitory, computer readable storage medium and the computer program code are configured to, with the processor, further cause the system to generate a set of masks based on the IC layout diagram.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure comprising:
   a first plurality of metal segments positioned in a first metal layer, each metal segment of the first plurality of metal segments extending in a first direction;
   a second plurality of metal segments positioned in a second metal layer overlying the first metal layer, each metal segment of the second plurality of metal segments extending in a second direction perpendicular to the first direction; and
   a third plurality of metal segments positioned in a third metal layer overlying the second metal layer, each metal segment of the third plurality of metal segments extending in the first direction,
   wherein a pitch of the third plurality of metal segments is smaller than a pitch of the second plurality of metal segments.

2. The IC structure of claim 1, wherein each of the pitch of the second plurality of metal segments and the pitch of the third plurality of metal segments is larger than the pitch of the first plurality of metal segments.

3. The IC structure of claim 1, further comprising a fourth plurality of metal segments positioned in a fourth metal layer overlying the third metal layer, each metal segment of the fourth plurality of metal segments extending in the second direction, wherein a pitch of the fourth plurality of metal segments is larger than the pitch of the second plurality of metal segments.

4. The IC structure of claim 1, wherein a metal segment of the first plurality of metal segments overlies a metal segment of a lowermost metal layer of the IC structure.

5. The IC structure of claim 4, wherein
   the first metal layer is a next consecutive metal layer overlying the lowermost metal layer,
   the second metal layer is a next consecutive metal layer overlying the first metal layer, and
   the third metal layer is a next consecutive metal layer overlying the second metal layer.

6. The IC structure of claim 1, wherein a ratio of the pitch of the second plurality of metal segments to the pitch of the third plurality of metal segments is greater than or equal to 1.25.

7. The IC structure of claim 1, further comprising a slot via between a metal segment of the second plurality of metal segments and a metal segment of the third plurality of metal segments.

8. A method of generating an integrated circuit (IC) layout diagram, the method comprising:
   arranging a plurality of second metal segments in a second metal layer overlying a first metal layer, wherein
      a second metal segment of the plurality of second metal segments overlaps a cell in the IC layout diagram, and
      the plurality of second metal segments has a first pitch in a first direction;
   arranging a plurality of third metal segments in a third metal layer, the plurality of third metal segments having a second pitch in a second direction perpendicular to the first direction; and
   arranging a plurality of fourth metal segments in a fourth metal layer, the plurality of fourth metal segments having a third pitch in the first direction,
   wherein
   the third pitch is smaller than the second pitch, and
   at least one of the arranging the plurality of second metal segments, arranging the plurality of third metal segments, or arranging the plurality of fourth metal segments is executed by a processor of a computer.

9. The method of claim 8, wherein a second metal segment of the plurality of second metal segments overlaps a first metal segment in the cell.

10. The method of claim 8, wherein a ratio of a height of the cell in the first direction to the first pitch is equal to or less than five.

11. The method of claim 8, wherein
   the cell is one cell of a plurality of cells, and
   the arranging the plurality of second metal segments in the second metal layer comprises at least one second metal segment of the plurality of second metal segments overlapping each cell of the plurality of cells.

12. The method of claim 8, wherein a ratio of the second pitch to the third pitch is greater than or equal to 1.25.

13. The method of claim 8, further comprising generating an IC layout file based on the layout diagram.

14. The method of claim 8, further comprising generating a set of masks based on the layout diagram.

15. A method of generating an integrated circuit (IC) layout diagram, the method comprising:
   aligning a plurality of first metal segments on first tracks of a first metal layer, the first tracks having a first pitch in a first direction and overlapping a cell in the IC layout diagram;
   aligning a plurality of second metal segments on second tracks of a second metal layer higher than the first metal layer, the second tracks having a second pitch in a second direction perpendicular to the first direction;
   aligning a plurality of third metal segments on third tracks of a third metal layer higher than the second metal layer, the third tracks having a third pitch in the first direction; and
   generating an IC layout file based on the IC layout diagram,
   wherein the third pitch is smaller than the second pitch.

16. The method of claim 15, wherein
   the cell has a cell height in the first direction, and
   a total of five first tracks overlap the cell along the cell height.

17. The method of claim 15, wherein at least one of
   the aligning the plurality of first metal segments comprises centering each first metal segment of the plurality of first metal segments on a corresponding first track of the first tracks,
   the aligning the plurality of second metal segments comprises centering each second metal segment of the plurality of second metal segments on a corresponding second track of the second tracks, or
   the aligning the plurality of third metal segments comprises centering each third metal segment of the plurality of third metal segments on a corresponding third track of the third tracks.

18. The method of claim 15, wherein a ratio of the second pitch to the third pitch is greater than or equal to 1.25.

19. The method of claim 15, further comprising aligning a plurality of fourth metal segments on fourth tracks of a fourth metal layer higher than the third metal layer, the fourth tracks having a fourth pitch in the second direction.

20. The method of claim 19, wherein a ratio of the fourth pitch to the third pitch is greater than or equal to 1.3.

* * * * *